United States Patent [19]
Gowers

[11] 3,981,755
[45] Sept. 21, 1976

[54] PHOTOCATHODE MANUFACTURE

[75] Inventor: Jonathan Paul Gowers, Salfords near Redhill, England

[73] Assignee: U.S. Philips Corporation, New York, N.Y.

[22] Filed: Dec. 19, 1974

[21] Appl. No.: 534,205

Related U.S. Application Data

[62] Division of Ser. No. 418,295, Nov. 23, 1973, Pat. No. 3,889,143.

[30] Foreign Application Priority Data

Aug. 21, 1973 United Kingdom ............... 54387/73

[52] U.S. Cl. ................................ 148/171; 148/172; 148/175; 252/62.3 GA; 313/94; 357/30;31

[51] Int. Cl.[2] ........................ H01L 7/36; H01L 7/38

[58] Field of Search ........... 148/171, 175, 172, 173; 252/62.3 GA; 313/94; 357/30, 31

[56] References Cited

UNITED STATES PATENTS

| | | | |
|---|---|---|---|
| 3,364,084 | 1/1968 | Ruehrwein | 148/175 |
| 3,478,213 | 11/1969 | Simon et al. | 313/95 X |
| 3,631,303 | 12/1971 | Antypas | 148/171 X |
| 3,672,992 | 6/1972 | Schaefer | 148/171 X |
| 3,699,401 | 10/1972 | Tietjfn | 357/30 |

OTHER PUBLICATIONS

Logan et al., Journal of Applied Physics, vol. 42, No. 6, May 1971, pp. 2328–2335.

*Primary Examiner*—G. Ozaki
*Attorney, Agent, or Firm*—Frank R. Trifari; Leon Nigohosian

[57] ABSTRACT

A photocathode structure containing a photocathode material, comprising a plate of single crystal gallium indium phosphide having major surfaces and relative proportions of gallium and indium such that the lattice parameter thereof is substantially the same as that of said photocathode material, and, an epitaxial layer of photocathode material located on a first said major surface of said crystal, the thickness of said layer of photocathode material being of the order of the diffusion length of electrons therein and at least part of a second said major surface of the gallium indium phosphide plate being substantially free from contact by solid material.

5 Claims, 1 Drawing Figure

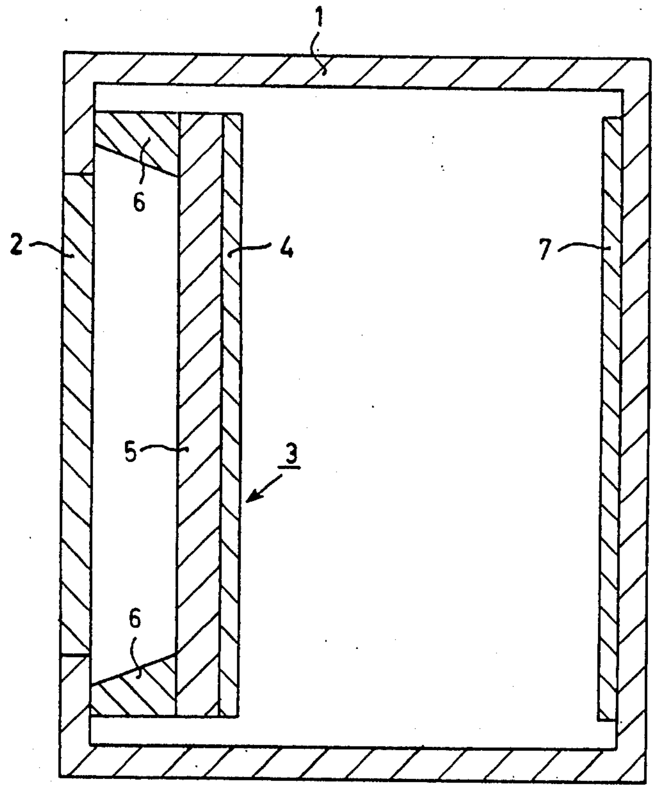
1
2
3
4
5
6
6
7

PHOTOCATHODE MANUFACTURE

The present application is a divisional application of U.S. application Ser. No. 418,295, filed Nov. 23, 1973, now U.S. Pat. No. 3,889,143.

This invention relates to a method of manufacturing a photocathode which includes a single crystal layer of photocathode material such as p-type gallium arsenide the thickness of which is of the order of the diffusion length of electrons therein.

U.S. Pat. No. 1,239,893 discloses the use of gallium aluminium arsenide for this purpose. A layer of the gallium aluminium arsenide is first grown on a gallium arsenide crystal, after which a thin p-type layer of gallium arsenide is grown on the free surface of the gallium aluminium arsenide. The original gallium arsenide crystal is finally completely removed to leave a thin layer of p-type gallium arsenide on gallium aluminium arsenide.

It is an object of the invention to provide an alternative material on which the thin layer of p-type gallium arsenide is provided.

According to one aspect the invention provides a method of manufacturing a photocathode which includes a single crystal layer of photocathode material (which may be p-type gallium arsenide) the thickness of which is of the order of the diffusion length of electrons therein, said method comprising the steps of:

a. growing a single crystal layer of gallium indium phosphide by an epitaxial technique on a single crystal substrate of the same chemical compound as said photocathode material, the phosphide having relative proportions of gallium and indium such that the lattice parameter thereof is substantially the same as that of said photocathode material,
b. subsequently growing said layer of photocathode material by an epitaxial technique on the free surface of the gallium indium phosphide layer, and
c. subsequently removing at least part of said substrate to expose the gallium indium phosphide.

According to another aspect the invention provides a photocathode structure comprising an epitaxial layer of photocathode material (which may be p-type gallium arsenide) on a major surface of a plate of single crystal gallium indium phosphide having relative proportions of gallium and indium such that the lattice parameter thereof is substantially the same as that of said photocathode material, the thickness of said layer of photocathode material being of the order of the diffusion length of electrons therein and at least part of the other major surface of the gallium indium phosphide plate being substantially free from contact by solid material.

An embodiment of the invention will now be described, by way of example, with reference to the diagrammatic drawing accompanying the Specification, which is an axial section of a proximity-type image intensifier and/or converter tube (not to scale).

In the drawing an evacuated cylindrical glass envelope 1 has an infra-red transmissive window 2 at one end. Adjacent this window inside the envelope is a photocathode assembly 3. The assembly 3 comprises a single crystal layer 4 of gallium arsenide 1 – 5 $\mu$m thick doped with for example $10^{18}$ – $10^{19}$ atoms of zinc per $cm^3$ to make it p-type. The layer 4 is provided epitaxially on a single crystal plate or disc 5 of gallium indium phosphide for example 10 – 20 $\mu$m thick. The material of the disc 5 has approximately equal atomic percentages (ideally 49% – 51%) of indium and gallium so that its lattice parameter is substantially the same as that of the gallium arsenide of layer 4. The periphery of the disc 5 is supported by a circular frame 6 of gallium arsenide secured to the envelope 1. The free surface of layer 4 is activated with caesium-oxygen in known manner and faces and is adjacent a cathodo-luminescent layer 7 provided on a transparent electrically conductive layer (not shown) on the opposite end wall of the envelope 1. Supply conductors (not shown) contacting the frame 6 and the conductive layer under the layer 7 are sealed through the envelope wall 1 and serve to provide the layer 7 with a positive potential relative to the photocathode assembly 3 in operation, so that any electron image produced at the free surface of the layer 4 by an image in infra-red or visible radiation focussed thereon through the window 2 results in a corresponding luminescent image being produced by the layer 7, this being viewed through the end wall of the envelope 1.

The photocathode assembly 3 may be manufactured as follows:

A single crystal plate of gallium arsenide for example 500 $\mu$m thick is polished and then has the plate 5 grown thereon by liquid epitaxy for example as described by Stringfellow in J. App. Physics 43 pages 3455–3460 (1972) or by vapour phase epitaxy for example by a method similar to that described by Nuese in Metallurgical Transactions 2 p. 789 et seq (March 1971). It has been found that, in the case of liquid epitaxy, provided the proportions of gallium and indium in the material used for the growth process are approximately correct (50%—50%), thermodynamic considerations favour the actual growth of gallium indium phosphide with relative proportions of gallium and indium such as to give a substantially exact lattice match with the underlying gallium arsenide (and thus also with the gallium arsenide layer 4 to be subsequently deposited on the free surface of the phosphide).

The layer 4 of p-type gallium arsenide is then provided on the free surface of the plate 5 either by vapour epitaxy as described for example by Tietjen and Amick, in J. Electrochem. Soc. 113, page 724 (1966) or by liquid epitaxy as described, for example by Panish, Sumski and Hayashi in Metall. Trans. 2, pp 795–801 (1971). The resulting GaAs-GaInP-GaAs sandwich is then masked, for example with wax, except for the central region of the original gallium arsenide plate, and etched for example with $H_2SO_4$:$H_2O_2$:$H_2O$ in the usual ratios, so that the central region of the original gallium arsenide plate is removed to leave the plate 5, layer 4 and frame 6 (the latter being formed by the remaining part of the original gallium arsenide plate).

The wax is dissolved and the layer 4 is then activated with caesium and oxygen, for example as described by Liu et al in Appl. Physics Letter 14 no. 9 page 275 et seq (1969) and positioned adjacent the phosphor layer in the envelope 1.

If desired the gallium arsenide 4 and 6 may be replaced by gallium indium arsenide or indium arseno phosphide.

What we claim is:

1. A method of manufacturing a photocathode which includes a single-crystal layer of photocathode material the thickness of which is of the order of the diffusion length of electrons therein, said method comprising the steps of:

a. growing a single crystal layer of gallium indium phosphide by an epitaxial technique on a single crystal substrate of gallium arsenide, said crystal layer having relative proportions of gallium and indium such that the lattice parameter thereof is substantially the same as that of said substrate, b. subsequently growing said layer of photocathode material of doped gallium arsenide by an epitaxial technique on the free surface of the gallium indium phosphide layer so that said photocathode material layer has a lattice parameter substantially the same as said single-crystal layer, and c. subsequently removing at least part of said substrate to expose the gallium indium phosphide.

2. A method of manufacturing a photocathode which includes a single crystal layer of p-type gallium arsenide the thickness of which is of the order of the diffusion length of electrons therein, said method comprising the steps of:

a. growing a single crystal layer of gallium indium phosphide by an epitaxial technique on a single crystal substrate of gallium arsenide, the phosphide having relative proportions of gallium and indium such that the lattice parameter thereof is substantially the same as that of gallium arsenide, b. subsequently growing said layer of p-type gallium arsenide by an epitaxial technique on the free surface of the gallium indium phosphide layer, and c. subsequently removing at least part of said gallium arsenide substrate to expose the gallium indium phosphide.

3. A method as claimed in claim 2, wherein the free surface of the gallium arsenide layer is activated with caesium-oxygen after the removal of the gallium arsenide substrate.

4. A method as claimed in claim 2, wherein the gallium indium phosphide is grown on the gallium arsenide substrate by liquid epitaxy.

5. A method as claimed in claim 2, wherein only the central region of the gallium arsenide substrate is removed to leave a frame of gallium arsenide around the periphery of the gallium indium phosphide layer.

* * * * *

UNITED STATES PATENT AND TRADEMARK OFFICE
CERTIFICATE OF CORRECTION

PATENT NO. : 3,981,755

DATED : September 21, 1976

INVENTOR(S) : JONATHAN PAUL GOWERS

It is certified that error appears in the above-identified patent and that said Letters Patent are hereby corrected as shown below:

In the Title Page, Section [30], "54387/73" should be --54387/72--;

Col. 1, line 11, insert as a separate paragraph, --It is necessary that the thickness of gallium arsenide photocathodes of the transmission type be of the order of the diffusion length of electrons therein because, if their thickness were appreciably greater, electrons excited by the absorption of input radiation would not be able to diffuse to the emissive surface of the photocathode without substantial recombination occurring. In practice this means that the thickness of the layer must be only a few microns. Because a free-standing layer of gallium arsenide with this order of thickness would be extremely fragile, it is

UNITED STATES PATENT AND TRADEMARK OFFICE

CERTIFICATE OF CORRECTION

PATENT NO. : 3,981,755

DATED : September 21, 1976

INVENTOR(S) : JONATHAN P. GOWERS

It is certified that error appears in the above-identified patent and that said Letters Patent are hereby corrected as shown below:

desirable to provide the layer on a substrate to give it mechanical strength. This substrate must, of course, transmit input radiation for absorption in the gallium arsenide layer. It must also have a crystalline lattice such that a single crystal layer of gallium arsenide can be grown thereon and such that the resultant lattice mismatch is sufficiently small that excessive interfacial recombination of electrons does not occur in the gallium arsenide. (Such recombination in general increases with increasing mismatch.) --

Signed and Sealed this

Thirtieth Day of November 1976

[SEAL]

*Attest:*

RUTH C. MASON
*Attesting Officer*

C. MARSHALL DANN
*Commissioner of Patents and Trademarks*